United States Patent
Hynecek et al.

(10) Patent No.: US 10,070,079 B2
(45) Date of Patent: Sep. 4, 2018

(54) HIGH DYNAMIC RANGE GLOBAL SHUTTER IMAGE SENSORS HAVING HIGH SHUTTER EFFICIENCY

(71) Applicant: SEMICONDUCTOR COMPONENTS INDUSTRIES, LLC, Phoenix, AZ (US)

(72) Inventors: Jaroslav Hynecek, Allen, TX (US); Bartosz Piotr Banachowicz, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 11 days.

(21) Appl. No.: 15/419,211

(22) Filed: Jan. 30, 2017

(65) Prior Publication Data

US 2018/0220086 A1 Aug. 2, 2018

(51) Int. Cl.
*H04N 5/355* (2011.01)
*H04N 5/378* (2011.01)
(Continued)

(52) U.S. Cl.
CPC ..... *H04N 5/3559* (2013.01); *H01L 27/14612* (2013.01); *H01L 27/14623* (2013.01); *H01L 27/14636* (2013.01); *H01L 27/14643* (2013.01); *H04N 5/3535* (2013.01); *H04N 5/3597* (2013.01); *H04N 5/363* (2013.01); *H04N 5/378* (2013.01)

(58) Field of Classification Search
CPC .. H04N 5/3559; H04N 5/3535; H04N 5/3597; H04N 5/363; H04N 5/378; H01L 27/14612; H01L 27/14623; H01L 27/14636; H01L 27/14643
See application file for complete search history.

(56) References Cited

U.S. PATENT DOCUMENTS 7,316,930 B1 1/2008 Montalbo
9,484,370 B2 11/2016 Leung et al.
(Continued)

OTHER PUBLICATIONS

Madurawe, Raminda et al., "Stacked-Die Image Sensors with Shielding," U.S. Appl. No. 15/155,245, filed May 16, 2016.

*Primary Examiner* — Twyler Haskins
*Assistant Examiner* — Fayez Bhuiyan
(74) *Attorney, Agent, or Firm* — Treyz Law Group, P.C.; Joseph F. Guihan

(57) ABSTRACT

A global shutter image sensor may include an array of image sensor pixels. Each pixel may have a photodiode, a charge storage region, low light level circuitry and high light level circuitry. During high light level conditions, some charge generated by the photodiode may be diverted to the high light level circuitry and the remainder may be transferred to the low light level circuitry. During low light level conditions, all of the generated charge may be transferred to the low light level circuitry. A light shielding structure may be formed over the charge storage region. The circuit components of each pixel may be divided between first and second chips. By forming the components on separate chips and by implementing high light level circuitry, the size of the charge storage region may be reduced while preserving the high dynamic range and low noise of the image sensor during all illumination conditions.

20 Claims, 7 Drawing Sheets

(51) Int. Cl.
    *H04N 5/353*     (2011.01)
    *H04N 5/359*     (2011.01)
    *H01L 27/146*     (2006.01)
    *H04N 5/363*     (2011.01)

(56) References Cited

U.S. PATENT DOCUMENTS

| | | |
|---|---|---|
| 2008/0210986 A1 | 9/2008 | Mauritzson |
| 2010/0230729 A1 | 9/2010 | Ellis-Monaghan |
| 2011/0072409 A1 | 3/2011 | Gambino |
| 2014/0085517 A1 | 3/2014 | Lenchenkov et al. |
| 2014/0263972 A1 | 9/2014 | Chua et al. |
| 2016/0211306 A1 | 7/2016 | Choi et al. |
| 2016/0286151 A1* | 9/2016 | Lahav ................ H04N 5/37452 |
| 2017/0005121 A1 | 1/2017 | Lenchenkov et al. |

* cited by examiner

HIGH DYNAMIC RANGE GLOBAL SHUTTER IMAGE SENSORS HAVING HIGH SHUTTER EFFICIENCY

BACKGROUND

This relates generally to imaging systems and, more particularly, to image sensors with High Dynamic Range (HDR) complementary metal-oxide-semiconductor (CMOS) image sensor arrays that are illuminated from the back side of a substrate and that operate in a Global Shutter (GS) mode. Global shutter image sensors require additional charge storage nodes in each image sensor pixel, which consume a significant portion of the available pixel area and thus increases the cost of the image sensors. In HDR image sensors, this problem is further exacerbated due to an additional requirement to store a larger amount of charge in the pixels than in non-HDR image sensors.

Modern electronic devices such as cellular telephones, cameras, and computers often use digital image sensors. Typical imager sensors (sometimes referred to as imagers) sense light by converting impinging photons into electrons (or holes) that are integrated (collected) in sensor pixels. Upon completion of each integration period, the collected charge is converted into voltage signals, which are supplied to corresponding output terminals associated with the image sensor. Typically, the charge-to-voltage conversion is performed directly within the pixels, and the resulting analog pixels voltage signals are transferred to the output terminal through various pixel addressing and scanning schemes. The analog voltage signal can be converted on-chip to a digital equivalent before being conveyed off-chip. Each pixel includes a buffer amplifier (i.e., source follower) that drives output sensing lines that are connected to the pixels via respective addressing transistors.

After the charge-to-voltage conversion is completed and after the resulting signals are transferred out from the pixels, the pixels are reset before a subsequent integration period begins. In pixels that include floating diffusions (FD) serving as the charge detection nodes, this reset operation is accomplished by momentarily turning on a reset transistor that connects the floating diffusion node to a voltage reference (typically the pixel current drain node) for draining (or removing) any charge transferred onto the FD node. However, removing charge from the floating diffusion node using the reset transistor generates thermal kTC-reset noise, as is well known in the art. This kTC reset noise must be removed using correlated double sampling (CDS) signal processing techniques in order to achieve desired low noise performance. Typical CMOS image sensors that utilize CDS require at least three (3T) or four transistors (4T) per pixel.

Standard CMOS sensors cannot be used for global shutter operations, because the corresponding pixel array is scanned in a sequential mode row by row. Scanning the pixel array row by row generates undesirable time skew in the image. When performing global shutter operations, it is thus necessary to incorporate another storage site into each pixel that can store charge transferred from all the photodiodes in the pixel simultaneously at one time. Charge then waits in this storage site for the sequential scan in a row by row fashion.

It is difficult adapting this device concept for high-dynamic-range (HDR) operations, as a large amount of charge must be stored in the pixels. This problem is typically solved by assigning some sensor rows or pixels in a group of pixels a shorter integration time. However, this method sacrifices the low light level resolution of the image sensor and can cause problems for rapidly changing scene illuminations. Another method is using a logarithmic charge to voltage conversion characteristic that typically has higher noise, which also sacrifices low light level performance.

It would therefore be desirable to be able to provide improved image sensor pixels for a large range of illumination levels in a global shutter mode of operation for an image sensor formed from multiple, stacked integrated circuits.

DETAILED DESCRIPTION

As electronic devices become smaller, more electronic devices are using "stacked" image sensors in which multiple integrated circuit chips are stacked on top of one another. Conductive interconnects that include metal wires, pads, or via are used to electrically connect the circuitry in one chip to the circuitry in another chip. Stacking multiple integrated circuit chips allows for pixel circuitry to be distributed between multiple integrated circuit chips. By distributing pixel circuitry across multiple integrated circuit chips, the charge storage regions for the pixels can be larger than the charge storage regions for pixels formed from a single integrated circuit.

Figure 1:
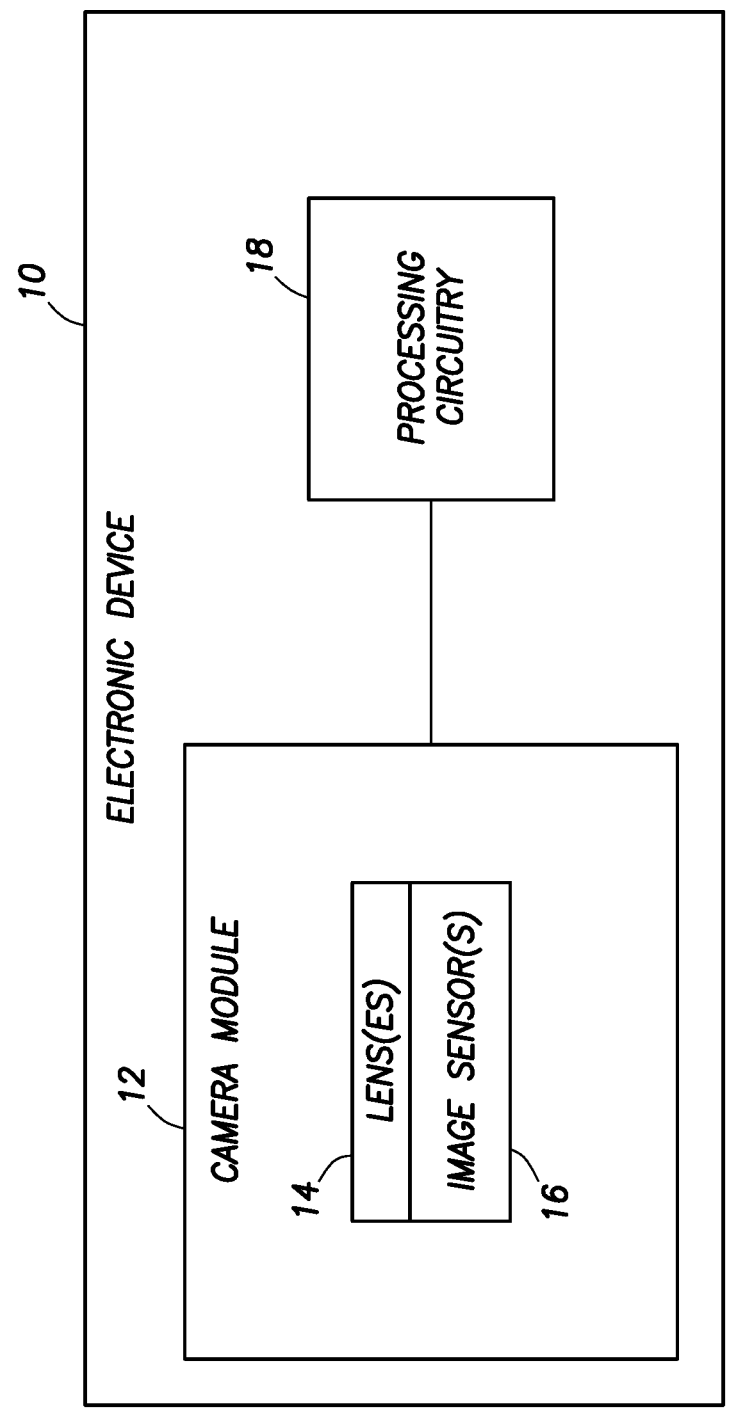
FIG. 1 is a schematic diagram of an illustrative electronic device that may include an image sensor in accordance with an embodiment.

An illustrative electronic device that may include a stacked-chip image sensor is shown in FIG. 1. Electronic device 10 (sometimes referred to herein as an imaging system) may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SoC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
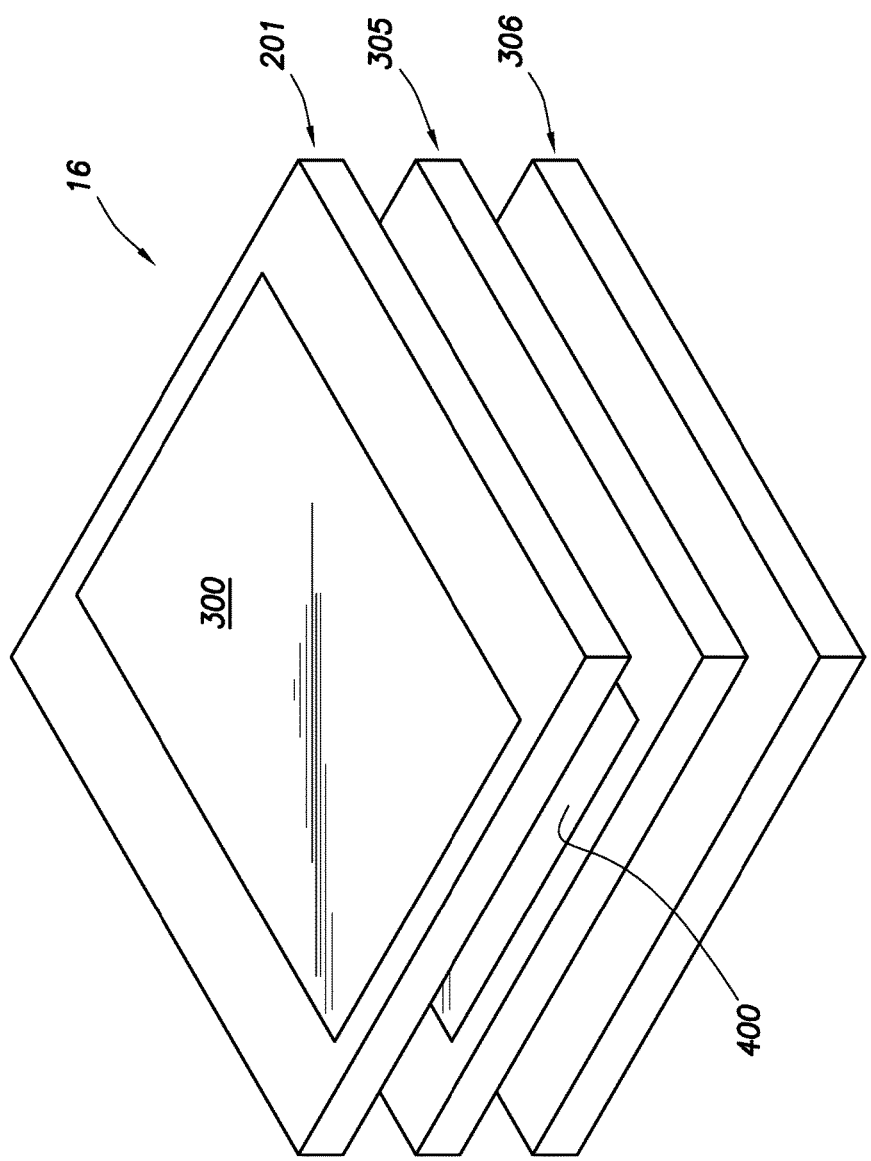
FIG. 2 is a schematic diagram of an illustrative image sensor with pixel and readout circuitry that is split among multiple stacked integrated circuits in accordance with an embodiment.

Image sensor 16 may be formed from multiple integrated circuits. As shown in FIG. 2, image sensor 16 may include integrated circuits (chips) such as chips 306, 305, and 201 that are formed in a vertical stack. The physical area of a single chip such as chip 201 may impose an upper limit on the area provided for photodiodes within the image sensor pixel array. This upper limit may limit the amount of charge that can be gathered and stored by the image sensor pixels. These limits can be mitigated by distributing components from the image sensor pixels across multiple integrated circuits so that each image sensor pixel in image sensor 16 includes components that are formed on two or more of chips 306, 305, and 201. For example, pinned photodiodes and charge transfer transistors for the image sensor pixels may be formed in first chip 201 while most of the remaining pixel circuit, including capacitors for storing high light level generated charge for achieving HDR operations, may be moved to one or more underlying chips such as chips 305 and/or 306.

Image sensor 16 may include an array of photodiodes and charge storage diodes such as array 300. Photodiodes in array 300 may be formed within corresponding image sensor pixels. The photodiodes in array 300 may generate charge in response to light. Charge storage diodes in array 300 may be formed within corresponding image sensor pixels. The charge storage diodes in array 300 may be used to store charge generated by the photodiodes. Array 300 may include other circuitry such as transistor circuitry. Array 300 may be formed on top chip 201. A color filter array (CFA) may be formed over the photodiodes on chip 201. Chip 201 may sometimes be referred to herein as photodiode/CFA chip 201.

A corresponding array of pixel circuits such as array 400 may be formed on middle chip 305. Array 400 may include an array of pixel circuits that are each used for handling charge generated by corresponding photodiodes in array 300, for example (circuitry 400 may sometimes be referred to herein as a pixel circuit array). The circuitry on chip 305 may include charge transfer transistors, floating diffusion circuitry for storing charge generated by array 300, amplifier transistors, or other pixel circuitry. Chip 305 may sometimes be referred to herein as in-pixel circuit chip 305. Other circuitry associated with the control and/or readout of signals from chips 305 and 201 such as clock generating circuits, pixel addressing circuits, signal processing circuits such as the CDS circuits, ADC circuits, digital image processing circuits and system interface circuits may be formed on bottom on chip 306. Chip 306 may be, for example, an application-specific integrated circuit (ASIC).

Chips 201, 305, and 306 may be coupled together using vertical conductive interconnects. For example, chips 201 and 305 may be bonded to each other with hybrid bonds that connect photodiodes in photodiode array 300 to circuitry 400. Chip 306 may be bonded to chip 305 using any suitable bonding technique. If desired, chip 306 may be hybrid bonded to chip 305 or may be fusion bonded to chip 305. Each bond may include a chip-to-chip bump, for example. Two bumps may be formed between chip 201 and chip 305 for each pixel (e.g., one bump for conveying low light level charge and another bump for conveying high light level charge). In one suitable arrangement, the vertical interconnects are formed along the periphery of the chips (e.g., around the periphery of array 300 on chip 201 and around the periphery of array 400 on chip 305).

Figure 3:
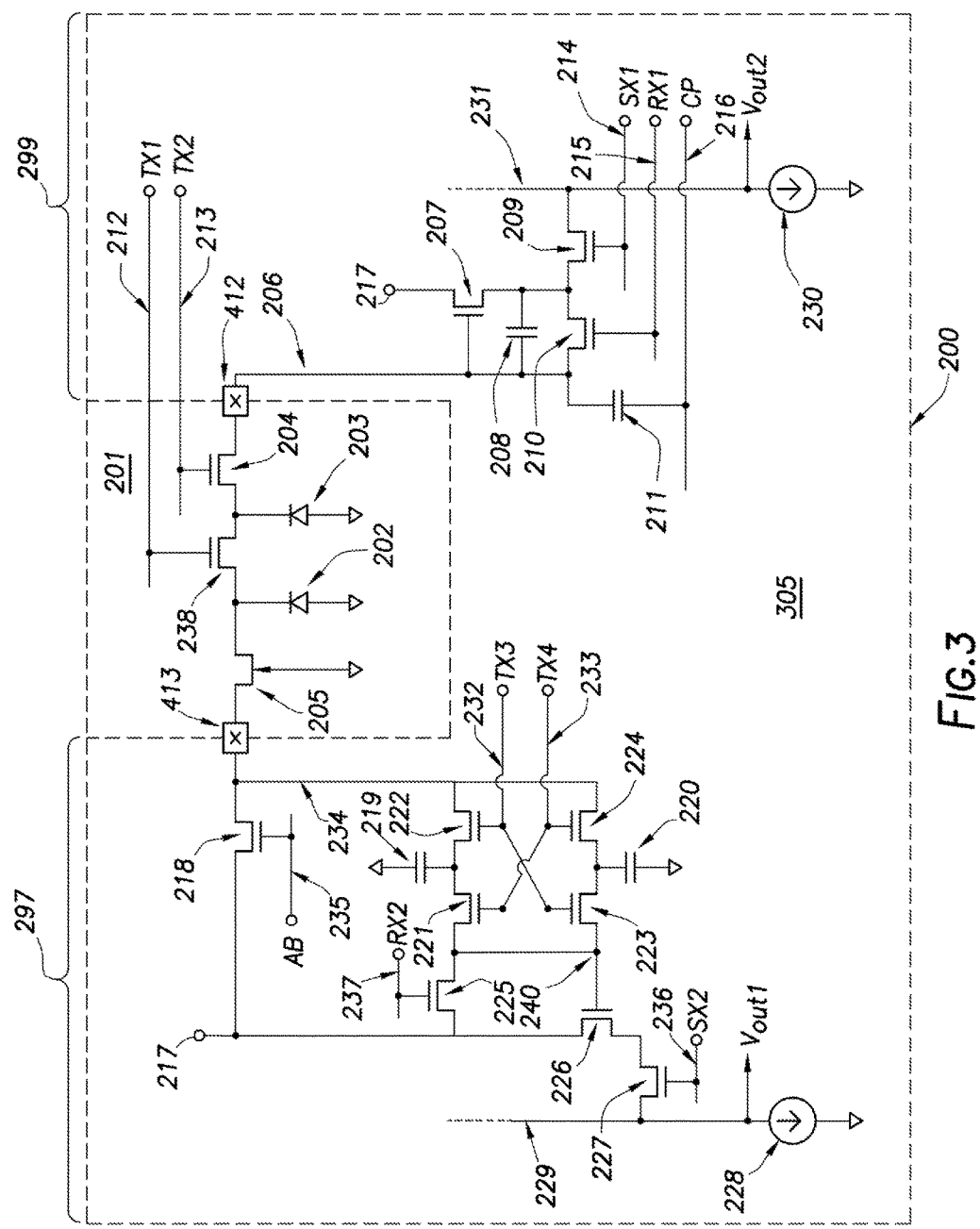
FIG. 3 is a circuit diagram of an illustrative pixel that may be used in a pixel array of the type shown in FIG. 2 in accordance with an embodiment.

A simplified pixel circuit diagram for an embodiment of the present invention is shown in FIG. 3. As shown in FIG. 3, pixel circuitry for a given pixel 200 is split between first chip 201 and second chip 305. The portion of pixel 200 formed on chip 201 may include a photosensitive element such as pinned photodiode 202, storage diode 203, transfer transistor 204, global shutter (GS) transistor 238, and overflow transistor 205. The ground bus line has been omitted from FIG. 3 for the sake of simplicity. The portion of pixel 200 formed on chip 305 may include pixel circuits such as low light level circuitry 299 and high light level circuitry 297. Low light level circuitry 299 may include signal gain p-channel transistor 207, feedback capacitor 208, row select transistor 209, reset transistor 210, floating diffusion node (FD) 206, and pre-charge capacitor 211. High light level circuitry 297 may include anti-blooming transistor 218, overflow capacitors 219 and 220, switching transistors 221, 222, 223, and 224, reset transistor 225, source follower transistor 226, and row select transistor 227.

During operation of image sensor 16, incident light is converted into electrical charge by photodiode 202. In low light level illumination conditions, all of the accumulated charge on photodiode 202 during a single integration period may be transferred to charge storage node 203 when GS signal TX1 is asserted on GS transistor 238 via row control signal line 212. Charge may be stored on charge storage node 203 until transfer signal TX2 is asserted on transfer transistor 204 via row control signal line 213. Charge is then transferred to floating diffusion node 206 on chip 305 through interconnect 412 (e.g., a vertical interconnect such as a bump). A portion of the floating diffusion region is formed on chip 201 between interconnect 412 and transistor 204. Charge stored on floating diffusion node 206 is sensed by transistor 207. Transistor 207 is connected as a gain amplifier and has a source terminal coupled to Vdd bias node 217. The gain is primarily determined by the capacitance of feedback capacitor 208, which is coupled between floating diffusion node 206 and the drain terminal of transistor 207. Because transistor 207 provides a gain to the signals, the circuit may sometimes be referred to as an amplifier or amplifier circuitry. The amplified output signal from transistor 207 is transferred to column signal line 231 when signal SX1 is asserted on row select transistor 209 via signal line 214. Column signal line 231 is biased with current source 230 and the output signal may be transferred off chip 305 for further processing. Floating diffusion node 206, transistor 207, and feedback capacitor 208 are reset when signal RX1 is asserted on reset transistor 210 via signal line 215. Pre-charge capacitor 211 delivers a predetermined amount of charge to floating diffusion 206 just before charge is transferred from storage node 203 to floating diffusion 206.

In pixels that are subject to high light level illumination conditions, the amount of accumulated charge on photodiode 202 for a single integration period becomes too large for low light level circuitry 299 to process without creating unwanted image artifacts. High light level circuitry 297 is therefore needed to process excess charge. Overflow transistor 205 may be a junction gate field-effect transistor (JFET) that forms a charge overflow barrier to prevent accumulated charge from flowing past overflow transistor 205 if the accumulated charge is lower than the overflow barrier. The overflow barrier may be established by various ion implants placed under its gate. The overflow barrier may have a relatively high level of pixel-to-pixel uniformity across image sensor 16. If accumulated charge in photodiode 202 is greater than that determined by the overflow barrier, excess charge may flow through overflow transistor 205 into high light level circuitry 297 for processing. If accumulated charge in photodiode 202 is less than that determined by the overflow barrier of overflow transistor 205, the accumulated charge is stopped by overflow transistor 205 and is read out using low light level circuitry 299, as described above.

Excess (overflow) charge passes through overflow transistor 205 to chip 305 by passing through interconnect (bump) 413. To realize a GS operation for the high light level, switches 221, 222, 223, and 224 may be switched from a charge integration mode to a charge storage mode when the GS pulse 212 is activated and the low light level accumulated charge from PD 202 is globally transferred by transistor 238 to storage node 203. The low light level accumulated charge is then transferred by transistor 204 from diode 203 in a sequential order row by row on FD node 206 where it is sensed by the corresponding amplifier formed by transistor 207 on second chip 305 (as described above). In controlling the switches for performing GS operations for the high light level, transfer signal TX3 may be asserted on switching transistor 222 along signal line 232 such that excess charge is allowed to pass through switching transistor 222 to first overflow capacitor 219, which stores the excess charge. At the same time, transfer signal TX3 is also asserted on switching transistor 223 so that excess charge from a previous integration period, which was stored on second overflow capacitor 220, is allowed to pass to floating diffusion node 240, where it is read out using source follower transistor 226 and row select transistor 227. After excess charge from the previous integration period has been read out and the high light level readout circuitry has been reset, transfer signal TX3 is de-asserted on switching transistors 222 and 223. To begin readout of excess charge stored on first overflow capacitor 219, transfer signal TX4 is asserted on switching transistors 221 and 224 along signal line 233. This allows excess charge stored on first overflow capacitor 219 to pass through switching transistor 221 to node 240 and also allows any excess charge from the next integration period to pass through switching transistor 224 to be stored on second overflow capacitor 220 (e.g., capacitors 219 and 220 may alternate between being used for storing overflow charge during integration and being used for reading the voltage at the beginning of each integration time).

When excess charge stored on first overflow capacitor 219 passes through switching transistor 221 to node 240, the excess charge is sensed by source follower transistor 226. Source follower transistor 226 has a drain terminal coupled to Vdd bias node 217. The output signal from source follower transistor 226 is transferred to column signal line 229 when signal SX2 is asserted on row select transistor 227 via signal line 236. Column signal line 229 is biased with current source 228 and the output signal may be transferred off chip 305 for further processing (e.g., via chip-to-chip interconnections such as bumps). Current source 228 may, for example, be located at the periphery of array 400. When it is desired to reset the high light level readout circuitry, reset signal RX2 is asserted on reset transistor 225 via signal line 237. When the high light level readout circuitry has been reset, transfer signal TX4 may be asserted on switching transistor 223 to allow excess charge for the next integration period, which may be stored on overflow capacitor 220, to pass to the high light level readout circuitry for readout. Anti-blooming control signal AB may be asserted on anti-blooming transistor 218 via signal line 235 to drain any excess charge stored on charge overflow node 234 that cannot be stored on overflow capacitors 219 or 220 if the excess charge exceeds the storage capacity of the overflow capacitors 219 or 220. This may cause excess charge stored on charge overflow node 234 to be drained by Vdd bias node 217.

By providing both high light level readout circuitry and low light level readout circuitry on second chip 305, image sensor 16 may be provided with high-dynamic-range (HDR) capabilities. The dynamic range of an image may be defined as the luminance ratio of the brightest element in a given scene to the darkest element in the given scene. Typically, cameras and other imaging devices capture images having a dynamic range that is smaller than that of real-world scenes. High-dynamic-range (HDR) imaging systems are therefore often used to capture representative images of scenes that have regions with high contrast, such as scenes that have portions in bright sunlight and portions in dark shadows. For pixels 200 that are located within relatively dark portions of the scene, the low light level readout circuitry may read out all of the captured image charge. For pixels 200 that are located within relatively bright portions of the scene, the high light level readout circuitry also reads out overflow charge to accurately represent the bright portion of the scene. The image signals generated by all of the pixels in the array are then combined into a single composite HDR image that accurately represents the brightly lit as well as the dark portions of the image and that has a higher dynamic range than conventional images in global shutter scanning mode.

Figure 4:
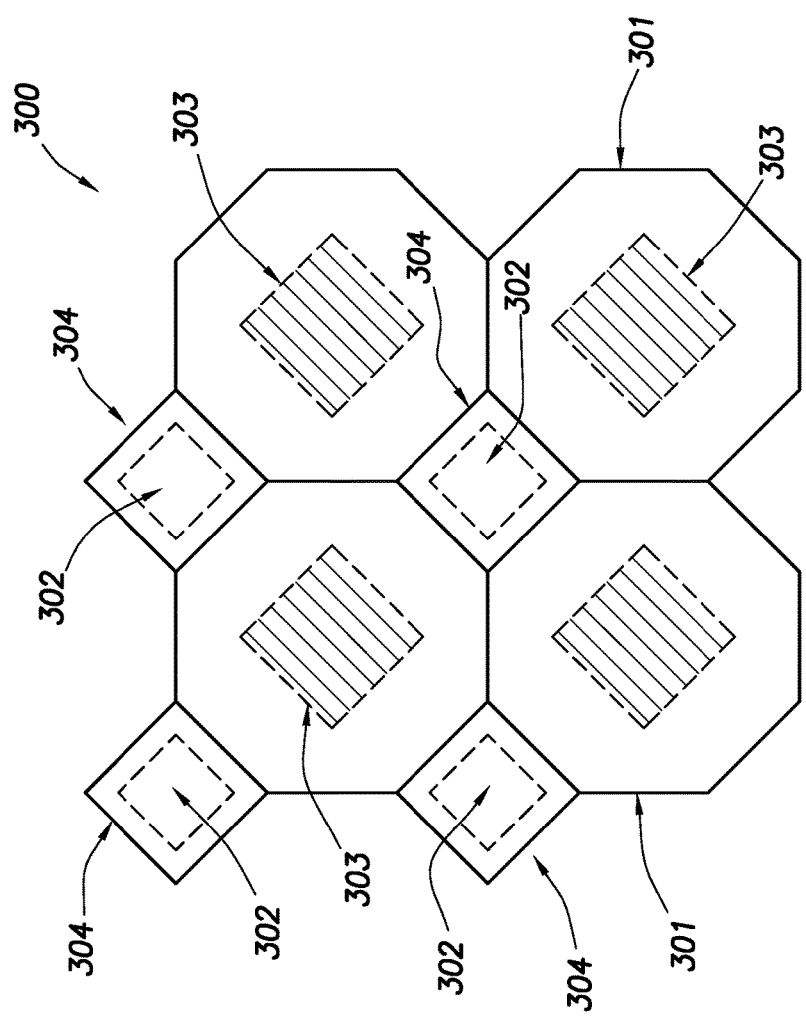
FIG. 4 is a diagram of a pixel array that is formed from pixels of the type shown in FIG. 3 in accordance with an embodiment.

FIG. 4 is a top-down view of an array 300 of illustrative GS photodiodes. As shown in FIG. 4, array 300 may be formed in top chip 201 and may be formed using multiple charge-generating photodiode regions 301 and charge storage photodiode regions 302. Each photodiode region 301 may include a corresponding photodiode 202 (FIG. 3) which is configured to convert incident light into electrical charge, and an interconnect region 303, which includes interconnect 413 that couples the photodiode region 301 to high light level circuitry 297 on middle chip 305. Each charge storage region 302 may include a charge storage node 203 (FIG. 3), which stores the electric charge generated in the photodiode region 301, and an interconnect region 304, which includes an interconnect 412 that couples the charge storage region 302 to low light level circuitry 299 on chip 305. Bumps may be coupled to interconnect regions 304 and 303 for conveying signals to middle chip 305. The image sensor in this example is back side illuminated and the bumps are formed on the front of chip 201. The charge storage pinned diodes have relatively high well capacity so their size may be small and optimized to store all of the low light level generated charge (e.g., storage regions 304 may be smaller than charge generating regions 301). This example is merely illustrative and, in general, any desired topology may be used.

Figure 5:
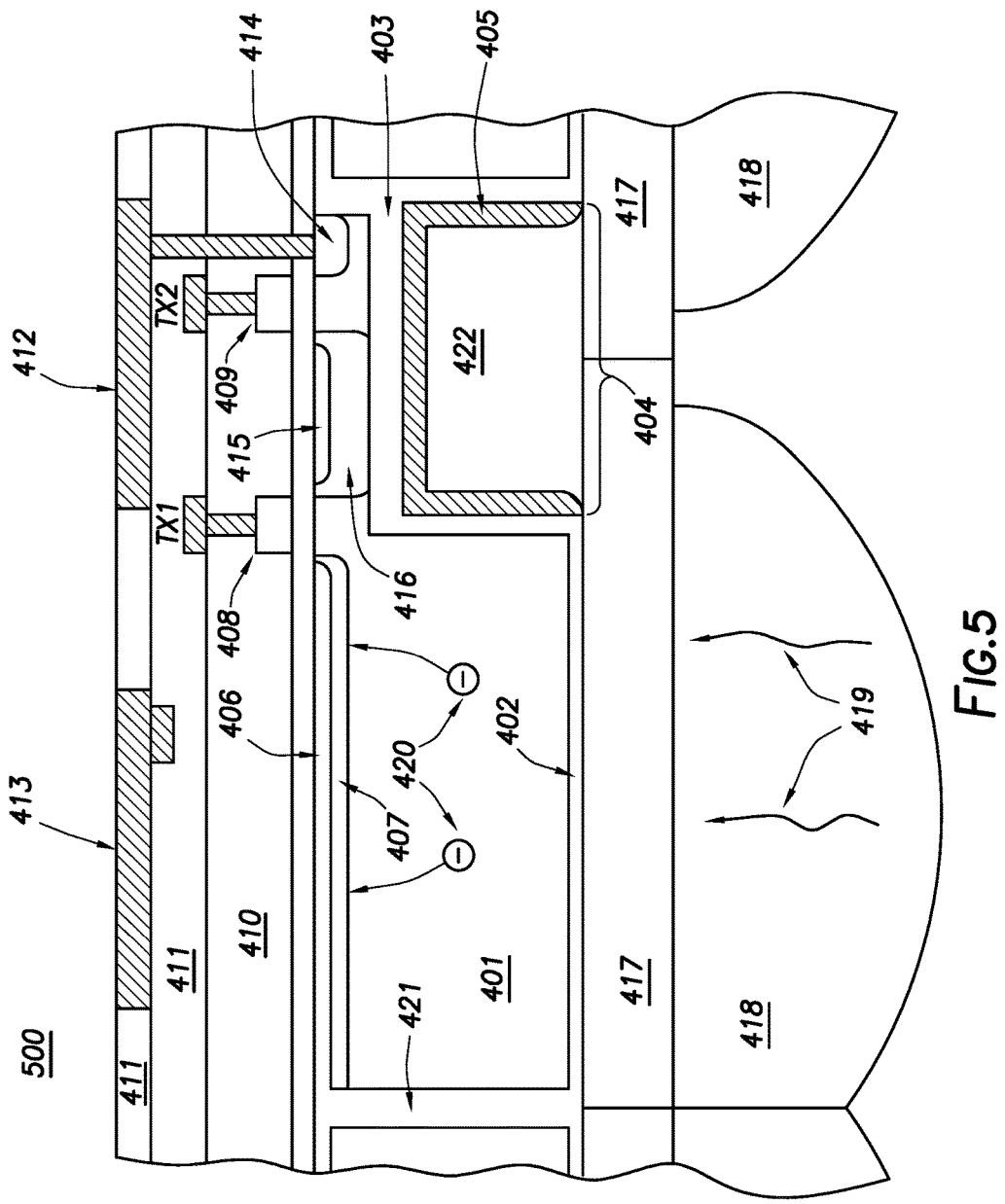
FIG. 5 is a cross-sectional side view of pixel circuitry for an illustrative pixel of the type shown in FIG. 3 in accordance with an embodiment.

FIG. 5 is a cross sectional view of an illustrative pixel. As shown in FIG. 5, pixel 500 may be a global shutter high dynamic range pixel (e.g., a pixel such as pixel 200 as shown in FIG. 3). Pixels 500 may be backside illuminated pixels. Incident light 419 may enter pixel 500 by passing through microlens 418, color filter element 417, and P+ type doped region 402. The photons generate electron-hole pairs within p− type doped epitaxial region 401 and the electrons 420 may be collected within region 407, which is adjacent to GS transfer gate 408. Together, region 401 and 407 may form a photodiode. P+ type doped regions, such as regions 406, 421, 402, and 403, may extend around the whole region 401 and may isolate region 401 to prevent the pixel signal cross talk and generation of excess dark current within pixel 500. When it is desired to transfer the collected electrons out of region 407, GS signal TX1 may be asserted on GS transfer gate 408. This operation is performed globally for all pixels in the array under the global shutter scheme. This allows the collected electrons to flow past GS transfer gate 408 and into the charge storage diode, formed from p+ pinning layer 415, electron storage layer 416, and p+ type doped region 403.

When it is desired to transfer the electrons from the charge storage diode, transfer signal TX2 may be asserted on transfer gate 409, allowing charge stored in the charge storage diode to flow past transfer gate 409 and into floating diffusion region 414. This operation is performed for all pixels on a selected row at a given time in a row by row fashion. Floating diffusion region 414 may be an n+ type doped region that is connected to interconnect 412 with via. Interconnect 412 and the via may be formed from metal and may be configured to transfer charge stored on floating diffusion region 414 to low light level circuitry 299 on chip 305. Floating diffusion 414 may be electrically connected to node 206 on chip 305 over interconnect 412 (FIG. 3). Amplifier transistor 207 on chip 305 may sense charge stored on node 414 and 206. An overflow transistor (not shown for the sake of simplicity) may be used to couple the photodiode to interconnect 413. Interconnect 413 may be formed from metal and may be configured to transfer any overflow charge to high light level circuitry 297. Oxide layers 410 and 411 may be used to isolate interconnects 412, 413 from the photodiode and storage diode.

Light shielding structures may be formed in region 404 to prevent the storage diode from generating unwanted charge due to incident light 419 directly interacting with the storage diode. A Back Side Deep Trench Isolation (BDTI) silicon etching processing (sometimes referred to herein simply as Deep Trench Isolation (DTI) processing) may be used to form a trench in the chip in region 404. Opaque layer 405 may be formed along the walls of the trench structure. Opaque layer 405 may be formed from a thin oxide layer and a metal layer (only the metal layer is shown for the sake of simplicity). The metal layer may be formed from Aluminum, Tungsten, or any other desired metal. Opaque layer 405 shields the storage diode, formed by p+ pinning layer 415 and electron storage layer 416, from light and prevents the storage diode from directly generating electric charge in response to light. Oxide 422 may be used to fill in the trench. P+ type doped region 403 may surround the light shielding structure (e.g., the sides of shield 405 that are not in contact with oxide 422). Region 403 may be located under electron storage layer 416 and may serve to increase the capacitance of the storage diode, thereby increasing the electron storage capacity of the storage diode and allowing the size of the storage diode to be reduced without sacrificing storage capacity (e.g., the storage diode may store all of the low light level generated electrons).

Figure 6:
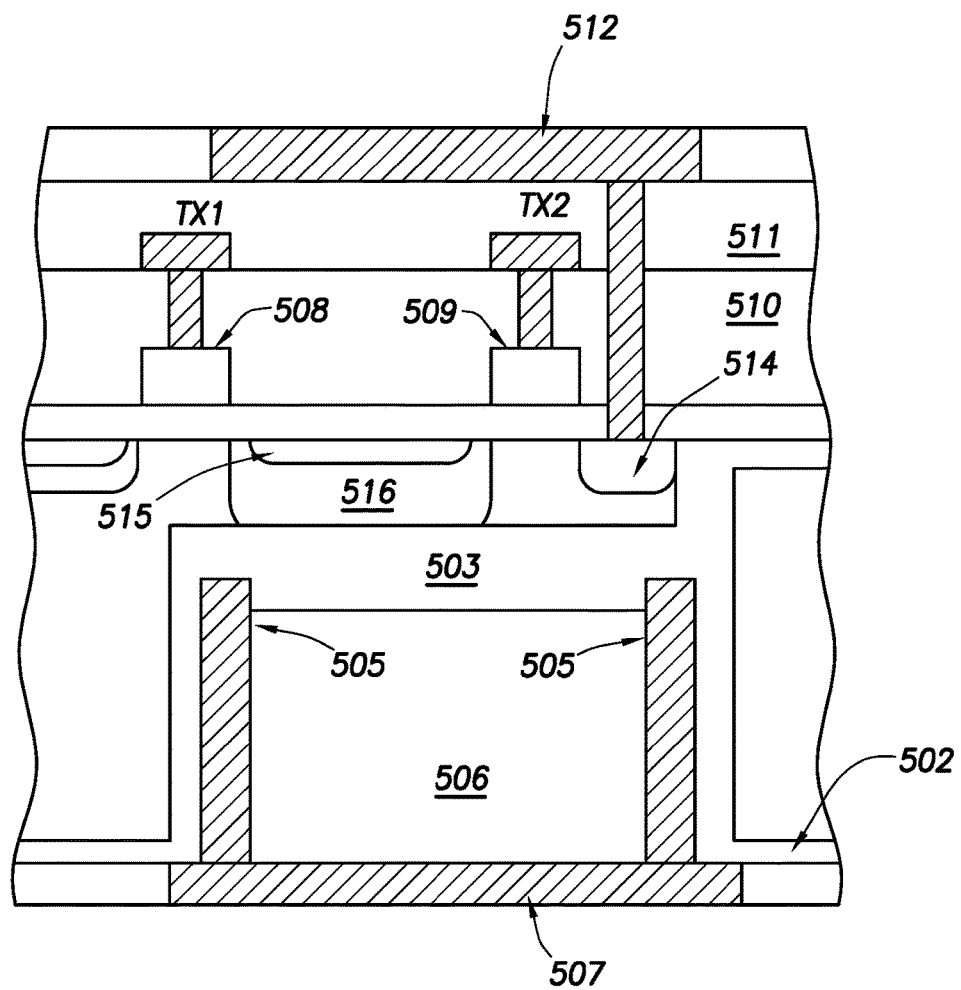
FIG. 6 is a cross-sectional side view of a portion of an illustrative pixel of the type shown in FIG. 3 in accordance with an embodiment.

An alternative embodiment of the light shielding structure is shown in FIG. 6. BDTI silicon etching processing may be used to form a trench in the chip. Opaque layers 505 may be formed along the side walls of the trench. Opaque layer 505 may be formed from a thin oxide layer and a metal layer (only the metal layer is shown for the sake of simplicity). Region 506 may be filled with any desired material. If desired, region 506 may be filled with oxide or may be filled with doped silicon. Metal cap 507 (e.g., metal cap sandwich 507) may be formed on the back side of the pixel and may cover the trench. P+ type doped regions 502 and 503 may surround the trench and region 503 may increase the well-capacity of the storage diode, which is formed from p+ pinning layer 515 and electron storage layer 516. The storage diode is configured to store charge generated in the photodiode when GS signal TX1 is asserted on GS transfer gate 508 and may be configured to transfer stored charge on the floating diffusion region 514 when transfer signal TX2 is asserted on transfer gate 509.

The above examples described in connection with FIGS. 1-6 describe an image sensor having HDR capabilities that is operable in a global shutter mode. The image sensor may use high light level overflow charge integration and storage on capacitors placed on a second chip (e.g., chip 305) thereby increasing the area available to photodiodes on first chip 201. Increasing the area of the photodiodes on first chip 201 may allow the photodiodes to have increased charge storage capacity and low dark current. Shielding structures such as shielding structures 405 (FIG. 5), 505, and 507 (FIG. 6) may prevent incoming light from reaching the storage areas on first chip 201. The arrangements outlined above may allow for collecting and storage of all charge generated in the photodiodes during one integration time. Charge for the low light level illumination is transferred for storage onto the pinned storage diode nodes (e.g., node 203 of FIG. 3) and later onto the FD nodes of the second chip 305, where it may be sensed and read out with low noise CDS kTC-reset noise suppression techniques after amplification by an in-pixel signal inverted feedback amplifier (e.g., transistor 207 of FIG. 3). The low light level generated charge storage diode nodes placed on the top chip are uniquely shielded from the impinging light and have high charge storage capacity in order to be physically small and not to occupy excessive area on top chip 201. The high light level illumination photodiode overflow charge is integrated and stored on the capacitors located on second chip 305 where the signal is sensed using source follower circuits on second chip 305. The back-side illuminated pixels have relatively large aperture efficiency, large quantum efficiency, high sensitivity, high shutter efficiency low dark current, and low readout noise relative to conventional image sensors. The resulting sensor arrays, which are operable in a global shutter scanning mode, may have a relatively high resolution and HDR capabilities which may be maintained for illumination levels exceeding 100 dBs, for example.

The examples of FIGS. 3-6 are merely illustrative. If desired, other charge storage devices may be used in other embodiments, such as polysilicon gates with barriers and wells built thereunder, similar as is constructed in CCD devices. However, the pinned diode storage regions are relatively easy to optimize in a given sensor process and are known to have a very low dark current leading to high sensor performance at high temperatures.

Figure 7:
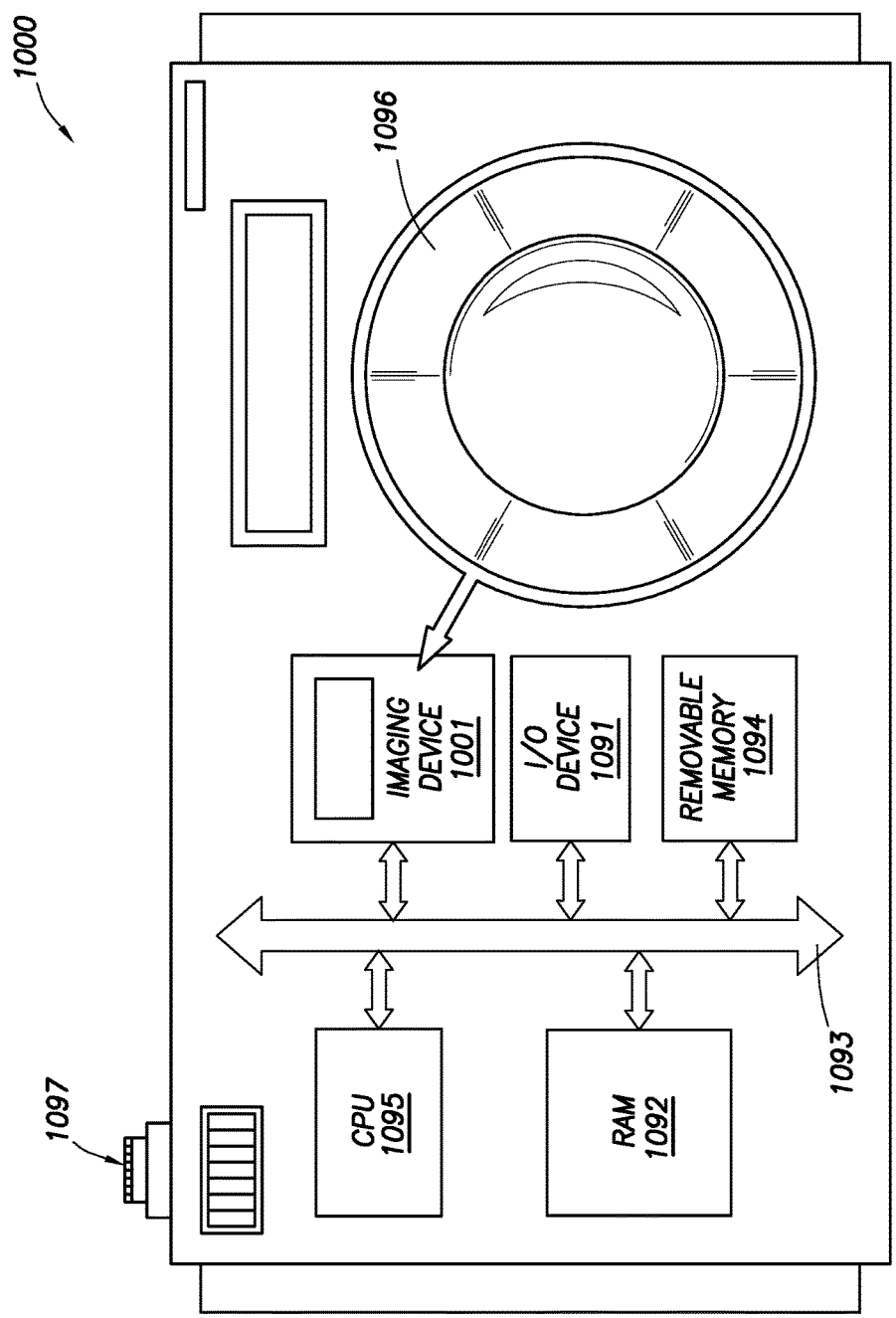
FIG. 7 is a block diagram of an illustrative processor system that may employ the embodiments of FIGS. 1-6 in accordance with an embodiment.

FIG. 7 shows in simplified form a typical processor system 1000, such as a digital camera, which includes an imaging device such as imaging device 1001 (e.g., an imaging device 1001 such as an image sensor that includes the backside illuminated global shutter pixels with a charge overflow structure and storage gate light shielding structure as described above in connection with FIGS. 2-6). Processor system 1000 is exemplary of a system having digital circuits that could include imaging device 1001. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1096 for focusing an image onto a pixel array when shutter release button 1097 is pressed. Processor system 1000 may include a central processing unit such as central processing unit (CPU) 1095. CPU 1095 may be a microprocessor that controls camera functions and one or more image flow functions and communicates with one or more input/output (I/O) devices 1091 over a bus such as bus 1093. Imaging device 1001 may also communicate with CPU 1095 over bus 1093. System 1000 may include random access memory (RAM) 1092 and removable memory 1094. Removable memory 1094 may include flash memory that communicates with CPU 1095 over bus 1093. Imaging device 1001 may be combined with CPU 1095, with or without memory storage, on a single integrated circuit or on a different chip. Although bus 1093 is illustrated as a single bus, it may be one or more buses or bridges or other communication paths used to interconnect the system components.

Various embodiments have been described illustrating an imaging system (e.g., image sensor pixel array) having a charge overflow structure that allows for a smaller charge storage region when the pixel array operates in global shutter operations. Dynamic range is also increased relative to conventional imaging systems.

The image sensor pixels may each include a photodiode that generates charge in response to image light, an additional charge storage region, a floating diffusion node, a global charge transfer-storage transistor configured to transfer the generated charge from the photodiode to the additional charge storage region, and a charge transfer transistor configured to transfer charge from the additional charge storage region to the floating diffusion node. A charge overflow circuit may be coupled to the photodiode and configured to divert overflow charge from the photodiode.

The charge overflow circuit may include four switching transistors, two overflow capacitors, a reset capacitor configured to reset charge stored on the capacitors, a source follower transistor, a row select transistor, and an anti-blooming transistor. Two of the switching transistors may act as a charge overflow barrier directing overflow charge from the photodiode to their respective overflow capacitors. The other two switching transistors may be used to allow readout of charge stored on a respective overflow capacitor by the source follower transistor and row select transistor. Charge from the photodiode may be diverted into one of the overflow capacitors during a high light level illumination condition, whereas no charge may be diverted to a capacitor during a low light level illumination condition. Charge from the photodiode may be diverted into the other overflow capacitor during a subsequent high light level illumination condition. This may reduce the additional charge storage region and may allow the image sensor to maintain a high dynamic range when operating in global shutter operation.

The array of photodiodes may be formed on a first chip and the charge overflow circuit may be formed on a second chip that is coupled to the first chip. The charge overflow circuit may be connected to the photodiode through an overflow transistor. The overflow transistor may be a JFET transistor that is configured to only allow charge to pass from the photodiode to the charge overflow circuit during high light level illumination conditions. Low light level circuitry that is coupled to the floating diffusion node may also be formed on the second chip. The circuitry on the second chip may be coupled to the circuitry on the first chip with an array of metal interconnects such that the pixel circuitry on the first chip is electrically connected to the charge overflow circuitry and the low light level circuitry on the second chip.

Each pixel in the pixel array may include a light shielding structure that is formed over the additional charge storage region to prevent the generation of electrical charge within the additional charge storage region. The light shielding structure may be formed from a trench in the first chip. An opaque layer that includes metal may be formed along the edge of the trench to block incident light from reaching the additional charge storage region.

The foregoing is merely illustrative of the principles of this invention and various modifications can be made by those skilled in the art without departing from the scope and spirit of the invention. The foregoing embodiments may be implemented individually or in any combination.

What is claimed is:

1. An imaging system comprising:
    a photodiode on a first chip that is configured to generate charge in response to image light;
    a charge storage diode on the first chip that is configured to store the generated charge;
    a global shutter transistor on the first chip that is coupled between the photodiode and the charge storage diode, wherein the global shutter transistor is configured to transfer the generated charge from the photodiode to the charge storage diode;
    low light level readout circuitry on a second chip that is vertically stacked with respect to the first chip;
    high light level readout circuitry on the second chip;
    a transfer transistor coupled between the charge storage diode and a first vertical conductive interconnect, wherein the first vertical conductive interconnect couples the first chip to the low light level readout circuitry on the second chip; and
    an overflow transistor coupled between the photodiode and a second vertical conductive interconnect, wherein the second vertical conductive interconnect couples the first chip to the high light level readout circuitry on the second chip.

2. The imaging system defined in claim 1, wherein the low light level readout circuitry comprises:
    a p-channel transistor having a gate terminal coupled to the first vertical conductive interconnect;
    an addressing transistor coupled to a drain terminal of the p-channel transistor;
    a pre-charge capacitor coupled between the first vertical conductive interconnect and a pre charge control line; and
    a pixel row address line, wherein the pixel row address line conveys row control signals to the addressing transistor to read out image signals from the low light level readout circuitry.

3. The imaging system defined in claim 2, wherein the low light level readout circuit comprises a feedback capacitor coupled between the gate terminal and the drain terminal of the p-channel transistor.

4. The imaging system defined in claim 1, wherein the charge overflow transistor is a junction gate field-effect transistor.

5. The imaging system defined in claim 1, wherein the high light level readout circuitry comprises:
a capacitor, wherein the overflow transistor is configured to transfer overflow charge from the photodiode to the capacitor and wherein the overflow transistor is configured to divert charge away from the photodiode and towards the capacitor only when the generated charge exceeds a given threshold level.

6. The imaging system defined in claim 1 wherein the overflow transistor is configured to divert charge away from the photodiode and towards the high light level readout circuitry when the generated charge exceeds a given threshold level.

7. The imaging system defined in claim 1 wherein the overflow transistor is configured to transfer a first portion of the generated charge to the high light level readout circuitry and the transfer transistor is configured to transfer a second portion of the generated charge to the low light level readout circuitry.

8. A stacked chip image sensor having first and second vertically stacked chips, comprising:
a photodiode on the first chip that generates charge in response to image light;
high light level circuitry on the second chip that is coupled to the photodiode on the first chip through a vertical conductive interconnect; and
a charge overflow transistor that is coupled between the photodiode and the vertical conductive interconnect, wherein the charge overflow transistor is configured to transfer overflow charge from the photodiode to the high light level circuitry over the vertical conductive interconnect, and wherein the high light level circuitry comprises:
first and second switching transistors; and
an overflow capacitor coupled between the first and second switching transistors, wherein the second switching transistor is coupled between the overflow capacitor and the vertical conductive interconnect and the overflow capacitor is configured to store at least some of the overflow charge.

9. The stacked chip image sensor defined in claim 8, wherein the high light level circuitry further comprises:
third and fourth switching transistors; and
an additional overflow capacitor, wherein the additional overflow capacitor is coupled between the third and fourth switching transistors, the fourth switching transistor is coupled between the vertical conductive interconnect and the additional overflow capacitor, and the additional overflow capacitor is configured to store at least some of the overflow charge.

10. The stacked chip image sensor defined in claim 9 the high light level circuitry further comprising:
a source follower transistor, wherein the overflow capacitor and the additional overflow capacitor are coupled in parallel between the vertical conductive interconnect and the source follower transistor.

11. The stacked chip image sensor defined in claim 9, further comprising:
first and second signal lines, wherein the first signal line is configured to provide a first control signal to the first and fourth switching transistors and the second signal line is configured to provide a second control signal to the second and third switching transistors.

12. The stacked chip image sensor defined in claim 9, wherein the charge overflow transistor is configured to divert the overflow charge away from the photodiode and towards the high light level circuitry when the generated charge exceeds a given threshold level.

13. The stacked chip image sensor defined in claim 12, wherein the photodiode is configured to capture the image light during a first integration period and a second integration period that is subsequent to the first integration period, wherein the photodiode generates a first amount of charge during the first integration period and a second amount of charge during the second integration period, and wherein, when the first and second amount of charges are both above the given threshold level, the charge overflow transistor is configured to transfer a first amount of excess charge to the high light level circuitry during the first integration period and a second amount of excess charge to the high light level circuitry during the second integration period.

14. The stacked chip image sensor defined in claim 13 wherein the first overflow capacitor is configured to store the first amount of excess charge and the second overflow capacitor is configured to store the second amount of excess charge.

15. The stacked chip image sensor defined in claim 14, wherein the high light level circuitry further comprises:
readout circuitry, wherein the overflow capacitor and the additional overflow capacitor are coupled in parallel between the readout circuitry and the vertical conductive interconnect, wherein the readout circuitry is configured to read out the first amount of excess charge from the first overflow capacitor during the first integration period and to read out the second amount of excess charge from the second overflow capacitor during the second integration period, wherein the readout circuitry comprises a source follower transistor and an addressing transistor;
a reset transistor coupled to the readout circuitry, wherein the reset transistor is configured to reset the amount of charge stored on the first overflow capacitor after the first integration period is complete and is configured to reset the amount of charge stored on the second overflow capacitor after the second integration period is complete; and
an anti-blooming transistor coupled to the vertical conductive interconnect, wherein the anti-blooming transistor is configured to drain a first amount of additional charge stored on the vertical conductive interconnect after the first integration period is complete and is configured to drain a second amount of additional charge stored on the vertical conductive interconnect after the second integration period is complete.

16. The stacked chip image sensor defined in claim 12, further comprising:
a charge storage diode on the first chip that stores the generated charge;
a global shutter transistor on the first chip coupled between the photodiode and the charge storage diode, wherein the charge overflow transistor is configured to transfer a first portion of the generated charge to the high light level circuitry and the global shutter transistor is configured to transfer a second portion of the generated charge to the charge storage diode when the generated charge is above the given threshold and wherein the global shutter transistor is configured to transfer all of the generated charge from the photodiode to the charge storage diode when the generated charge is below the given threshold; and low light level readout circuitry on the second chip that is coupled to the charge storage diode through a charge transfer transistor on the first chip and through an additional vertical conductive interconnect between the first and second chips, wherein the charge transfer transistor is configured to transfer the charge stored on the charge storage diode to the low light level readout circuitry.

17. A backside-illuminated image sensor pixel, comprising:

a charge generation region, wherein the charge generation region is configured to generate charge in response to image light;

a charge storage region, wherein the charge storage region is configured to store the charge generated by the charge generation region;

a global shutter transfer gate formed between the charge generation region and the charge storage region, wherein the global shutter transfer gate is configured to transfer the generated charge from the charge generation region to the charge storage region;

a light shielding structure adjacent to the charge storage region, wherein the light shielding structure is configured to shield the charge storage region from the image light, and wherein the light shielding structure comprises a trench region and a metal layer formed on at least two sides of the trench region; and a p+ type doped region interposed between the charge storage region and the light shielding structure.

18. The back-side illuminated image sensor pixel defined in claim 17, wherein an oxide material is formed within the trench region, the p+ type doped region is in direct contact with the charge storage region, and the metal layer is interposed between the p+ type doped region the oxide material.

19. The back-side illuminated image sensor pixel defined in claim 17, wherein a material is formed within the trench region, the p+ type doped region is in direct contact with the charge storage region and a first side of the material, and the light shielding structure comprises a metal cap that is in direct contact with a second side of the material that opposes the first side of the material in the trench region.

20. The imaging system defined in claim 1, further comprising:

oxide layers that isolate the first and second vertical conductive interconnects from each other, from the photodiode, and from the charge storage diode.

* * * * *